United States Patent
Kim

(10) Patent No.: US 6,780,688 B2
(45) Date of Patent: Aug. 24, 2004

(54) AMEL DISPLAY PANEL AND METHOD FOR FABRICATING THE SAME

(75) Inventor: Chang Nam Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 10/448,300

(22) Filed: May 30, 2003

(65) Prior Publication Data

US 2003/0227019 A1 Dec. 11, 2003

(30) Foreign Application Priority Data

Jun. 7, 2002 (KR) ............................. 10-2002-0031898

(51) Int. Cl.⁷ .............................................. H01L 21/00
(52) U.S. Cl. ........................................ 438/149; 257/72
(58) Field of Search ............................................ 257/72

(56) References Cited

U.S. PATENT DOCUMENTS 5,516,577 A * 5/1996 Matsuura et al. ............ 428/212
5,767,623 A * 6/1998 Friedman et al. ........... 313/509

* cited by examiner

*Primary Examiner*—David Nelms
*Assistant Examiner*—Thao P. Le
(74) *Attorney, Agent, or Firm*—Fleshner & Kim, LLP

(57) ABSTRACT

AMEL display panel including a substrate having a plurality of transistors, a planarizing layer on the substrate, an adhesive layer of silicon oxide, silicon nitride, or ITO on the planarizing layer, a first electrode on the adhesive layer connected to the transistor electrically, an organic electroluminescence (EL) layer on the first electrode, and a second electrode on the organic EL layer.

12 Claims, 2 Drawing Sheets

AMEL DISPLAY PANEL AND METHOD FOR FABRICATING THE SAME

This application claims the benefit of the Korean Application No. P2002-31898 filed on Jun. 7, 2002, which is hereby incorporated by reference.

BACKGROUND OF THE INVENTION

1. Field of the Invention

The present invention relates to display panels, and more particularly, to an Active Matrix ELectroluminescence (AMEL) display panel and a method for fabricating the same.

2. Background of the Related Art

In general, in the AMEL display panels, there are passive matrix EL display panels and active matrix EL display panels depending on structures and operating methods of the EL display panels.

In general, the AMEL display panel employs a bottom emission system in which a light is emitted to an under side of a glass substrate. However, the bottom emission system has a tendency to reduce a light emission area due to TFT (Thin Film Transistor) on the glass substrate that blocks the light. Therefore, the bottom emission system reduces an aperture in geometrical progression as a size of the TFT becomes the greater and a number of the TFT increases the more.

Consequently, a top emission system that overcomes the drawback of the bottom emission system is developed. Since the top emission system emits a light to an upper side of the glass substrate, the aperture can be increased regardless of the TFT. In the top emission system, either a cathode or an anode is used as a reflective plate.

When the cathode is used as the reflective plate, the AMEL display panel has a structure in which the cathode, an organic EL layer, and the anode which is a transparent are formed on the glass substrate in succession.

When the anode is used as the reflective plate, the AMEL display panel has a structure in which the anode, the organic EL layer, and the cathode which is a transparent are formed on the glass substrate in succession.

In general, it is difficult to form the transparent anode on the organic EL layer in fabrication of the AMEL display panel. Therefore, the top emission system in which the anode is used as the reflective plate is employed, mostly. FIG. 1 illustrates a related art AMEL display panel.

Referring to FIG. 1, the AMEL display panel is provided with a substrate 11 having a TFT 12 and a storage capacitor 13, a planarizing layer 14 on the substrate 11, an anode 16 on the planarizing layer 14 so as to be connected to the TFT 12, an insulating layer 15 for isolating pixels, an organic EL layer 17 on the anode 16, a cathode 18 on the organic EL layer 17, and a protection layer 19 on the cathode 18.

Thus, the display panel of the top emission system is fabricated by planarizing the substrate having the TFT formed thereon, forming a via hole, and forming light emissive pixels.

However, the planarizing layer 14 has a poor adhesive force with the anode which is used as the reflective layer, because of the organic substance of the planarizing layer 14. The poor adhesive force between the anode of a metal and the planarizing layer of an organic substance causes difficulty in formation of the pixels, that deteriorates a performance of the display panel.

SUMMARY OF THE INVENTION

Accordingly, the present invention is directed to an AMEL display panel and a method for fabricating the same that substantially obviates one or more of the problems due to limitations and disadvantages of the related art.

An object of the present invention is to provide an AMEL display panel and a method for fabricating the same which permits an easy and stable fabrication of a display panel.

Additional features and advantages of the invention will be set forth in the description which follows, and in part will be apparent to those having ordinary skill in the art upon examination of the following or may be learned from practice of the invention. The objectives and other advantages of the invention will be realized and attained by the structure particularly pointed out in the written description and claims hereof as well as the appended drawings.

To achieve these objects and other advantages and in accordance with the purpose of the present invention, as embodied and broadly described herein, the active matrix electroluminescence (AMEL) display panel includes a substrate having a plurality of transistors, a planarizing layer on the substrate, an adhesive layer on the planarizing layer, a first electrode on the adhesive layer connected to the transistor electrically, an organic electroluminescence (EL) layer on the first electrode, and a second electrode on the organic EL layer.

The adhesive layer is formed of silicon oxide, silicon nitride, or ITO (Indium Tin Oxide).

The first electrode is an anode, and the second electrode is a cathode.

The AMEL display panel may further includes an intermediating layer between the first electrode and the organic EL layer formed of ITO (Indium Tin Oxide).

In another aspect of the present invention, there is provided a method for fabricating an AMEL display panel, including the steps of forming a plurality of transistors on a substrate, forming a planarizing layer on the substrate having the transistors formed thereon, forming an adhesive layer on the planarizing layer, and forming a first electrode on the adhesive layer so as to be connected to the transistors electrically, forming an organic EL layer on the first electrode, and forming a second electrode on the organic EL layer.

The step of forming a first electrode includes the steps of forming an adhesive layer on the planarizing layer, etching predetermined regions of the adhesive layer and the planarizing layer, to form contact holes, and forming a first electrode on the adhesive layer so as to be connected to the transistors through the contact holes, electrically.

The adhesive layer is formed of silicon oxide or silicon nitride.

The step of forming a first electrode includes the steps of etching predetermined regions of the planarizing layer, to form contact holes, forming an adhesive layer on the planarizing layer so as to be connected to the transistors through the contact holes, and forming a first electrode on the adhesive layer.

The adhesive layer is formed of ITO (Indium Tin Oxide).

The method further includes the step of forming an intermediating layer of ITO on the first electrode after step of forming the first step.

It is to be understood that both the foregoing description and the following detailed description of the present invention are exemplary and explanatory and are intended to provide further explanation of the invention claimed.

BRIEF DESCRITPION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE PREFERRED EMBODIMENT

Figure 1:
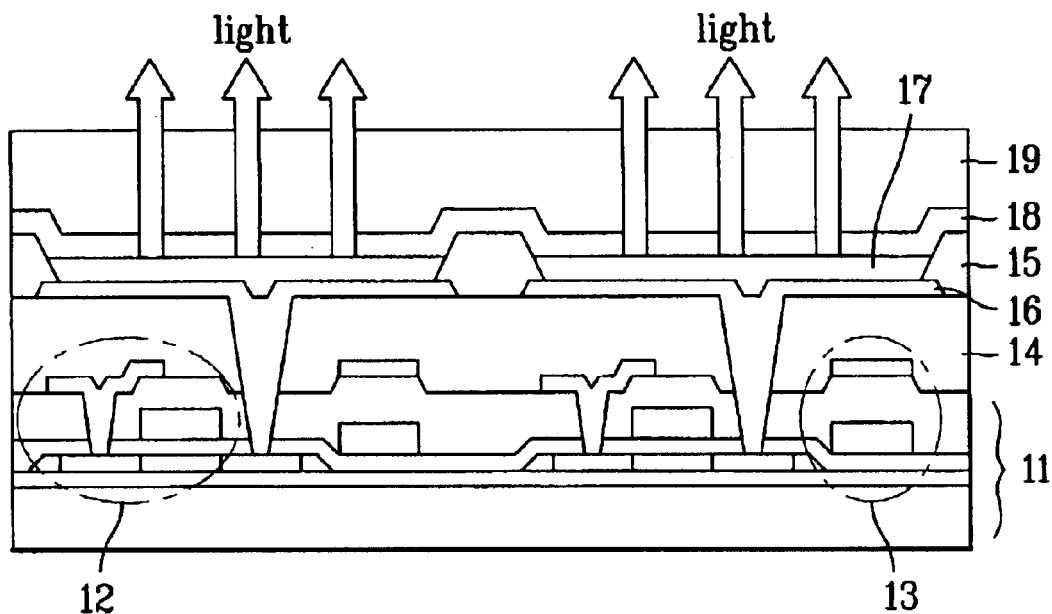
FIG. 1 illustrates a related art AMEL display panel.
Figure 2:
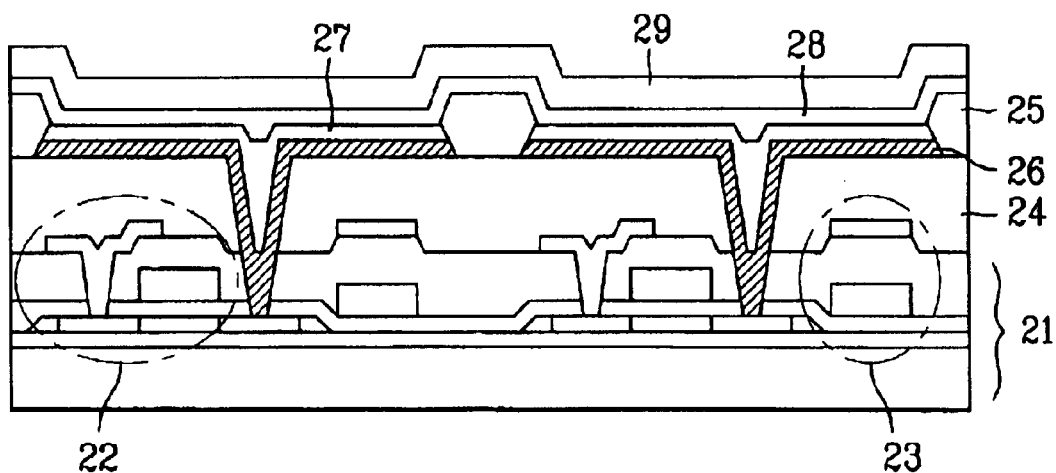
FIG. 2 illustrates an AMEL display panel in accordance with a first preferred embodiment of the present invention.

Reference will now be made in detail to the preferred embodiments of the present invention, examples of which are illustrated in the accompanying drawings. FIG. 2 illustrates an AMEL display panel in accordance with a first preferred embodiment of the present invention.

Referring to FIG. 2, a predetermined thickness of planarizing layer 24 is formed on a substrate 21 having a plurality of TFTs and storage capacitors 23 formed thereon. Then, the planarizing layer 24 and an underlying insulating layer are removed selectively by photolithography and etching. In this instance, a contact hole to a drain region of the TFT 22 is formed.

Next, an adhesive layer 26 is formed on the planarizing layer 24 to be electrically connected to the drain region of the TFT 22 through the contact hole. The adhesive layer 26 is formed of ITO (Indium Tin Oxide).

Then, a first electrode 27 is formed on the adhesive layer 26. The first electrode 27 is an anode used as a reflective layer.

An organic EL layer 28 is formed on the first electrode 27, and an insulating layer 25 is formed for isolation of pixels. After removal of the organic EL layer 28, the first electrode 27 and the adhesive layer 26 from between pixels, the insulating layer 25 is formed on an exposed planarizing layer 24.

Then, a second electrode 29, which is a cathode, is formed on the organic EL layer 28, and a protection layer (not shown) is formed on the second electrode 29, to complete fabrication of the AMEL display panel.

Thus, in the present invention, by forming an adhesive layer 26 between the planarizing layer 24 and the first electrode 27, an adhesive force between the planarizing layer 24 and the first electrode 27 is improved.

Accordingly, as the etchant used in wet etching for forming the insulating layer 25 is infiltrated between the planarizing layer 24 and the first electrode 27, the coming apart of the first electrode 27 from the planarizing layer 24 can be prevented.

Figure 3:
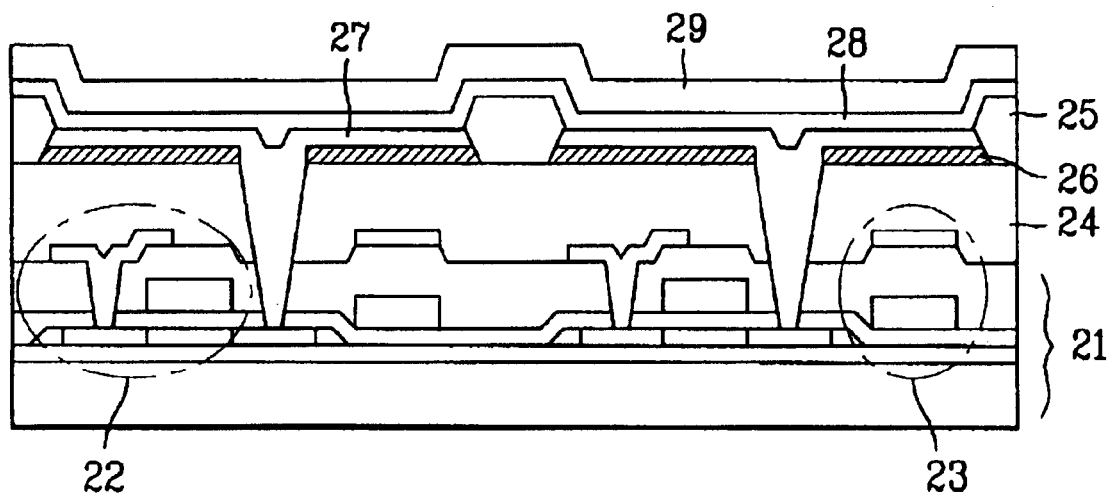
FIG. 3 illustrates an AMEL display panel in accordance with a second preferred embodiment of the present invention.

FIG. 3 illustrates an AMEL display panel in accordance with a second preferred embodiment of the present invention. The second embodiment of the present invention suggests employing silicon oxide or silicon nitride as a material of the adhesive layer 26, when the fabrication process differs from the first embodiment of the present invention.

Referring to FIG. 3, a predetermined thickness of planarizing layer 24 is formed on a substrate 21 having a plurality of TFTs 22 and storage capacitors 23 formed thereon. An adhesive layer 26 is formed on the planarizing layer 24. The adhesive layer 26 is formed of silicon oxide or silicon nitride.

Then, the adhesive layer 26, the planarizing layer 24, and an underlying insulating layer are removed selectively by photolithography and etching. In this instance, a contact hole to a drain region of the TFT 22 is formed.

Next, a first electrode 27 is formed to be electrically connected to the drain region of the TFT 2 through the contact hole. The first electrode 27 is an anode used as a reflective layer.

Then, an organic EL layer 28 is formed on the first electrode 27, and an insulating layer 25 is formed between pixels for insulating between the pixels.

The, a second electrode 29, which is a cathode, is formed on the organic EL layer 28, and a protection layer (not shown) is formed on the second electrode 29, to complete fabrication of the AMEL display panel.

Thus, as the present invention forms the adhesive layer 26 between the planarizing layer 24 and the first electrode 27, an adhesive force between the planarizing layer 24 and the first electrode 27 is improved.

Figure 4:
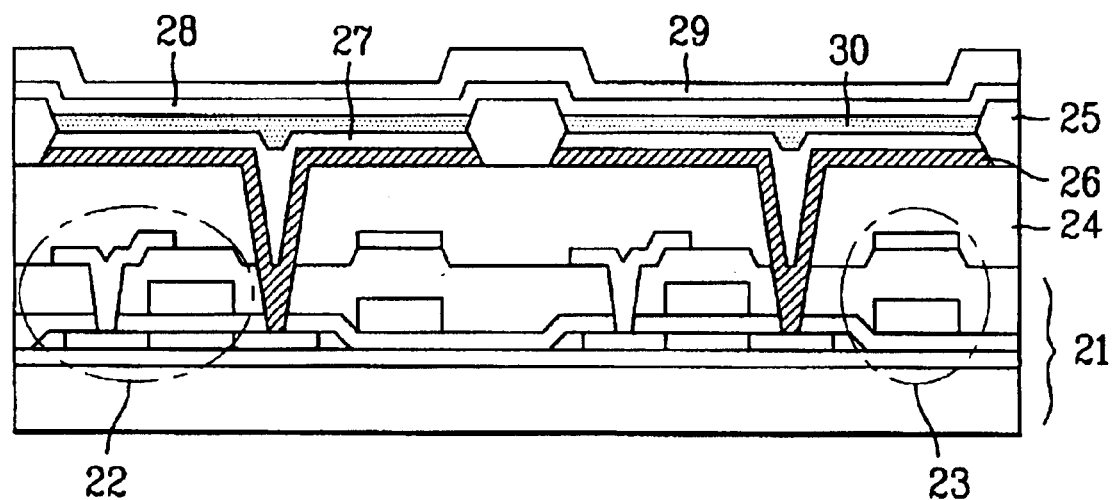
FIG. 4 illustrates an AMEL display panel in accordance with a third preferred embodiment of the present invention.

FIG. 4 illustrates an AMEL display panel in accordance with a third preferred embodiment of the present invention. In the third embodiment of the present invention, an intermediating layer 30 is further formed between a first electrode 27 and an organic EL layer 28 on the adhesive layer 26 for improving a performance of the display panel. The intermediating layer 30 is formed of ITO (Indium Tin Oxide) or the like.

The intermediating layer 30 serves to match work functions of the first electrode 27 and a Hole Injecting Layer (HIL) of the organic EL layer 28. The intermediating layer 30 improves the performance of the display panel, further.

The strengthening of the adhesive force between the first electrode and the planarizing layer by means of the adhesive layer permits an easy and stable fabrication of the display panel.

The intermediating layer between the first electrode and the organic EL layer improves a display performance.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An active matrix electroluminescence (AMEL) display panel comprising:

a substrate having a plurality of transistors;

a planarizing layer on the substrate;

an adhesive layer on the planarizing layer;

a first electrode on the adhesive layer connected to the transistor electrically;

an organic electroluminescence (EL) layer on the first electrode; and a second electrode on the organic EL layer.

2. The AMEL display panel as claimed in claim 1, wherein the adhesive layer is formed of silicon oxide, silicon nitride, or ITO (Indium Tin Oxide).

3. The AMEL display panel as claimed in claim 1, wherein the first electrode is an anode, and the second electrode is a cathode.

4. The AMEL display panel as claimed in claim 1, further comprising an intermediating layer between the first electrode and the organic EL layer.

5. The AMEL display panel as claimed in claim 4, wherein the intermediating layer is formed of ITO (Indium Tin Oxide).

6. A method for fabricating an AMEL display panel, comprising the steps of:

forming a plurality of transistors on a substrate;

forming a planarizing layer on the substrate having the transistors formed thereon;

forming an adhesive layer on the planarizing layer, and forming a first electrode on the adhesive layer so as to be connected to the transistors, electrically;

forming an organic EL layer on the first electrode; and forming a second electrode on the organic EL layer.

7. The method as claimed in claim 6, wherein the step of forming a first electrode includes the steps of;

forming an adhesive layer on the planarizing layer, etching predetermined regions of the adhesive layer and the planarizing layer, to form contact holes, and forming a first electrode on the adhesive layer so as to be connected to the transistors through the contact holes electrically.

8. The method as claimed in claim 7, wherein the adhesive layer is formed of silicon oxide or silicon nitride.

9. The method as claimed in claim 6, wherein the step of forming a first electrode includes the steps of;

etching predetermined regions of the planarizing layer, to form contact holes, forming an adhesive layer on the planarizing layer so as to be connected to the transistors through the contact holes, and forming a first electrode on the adhesive layer.

10. The method as claimed in claim 9, wherein the adhesive layer is formed of ITO (Indium Tin Oxide).

11. The method as claimed in claim 6, further comprising the step of forming an intermediating layer on the first electrode after step of forming the first step.

12. The method as claimed in claim 11, wherein the intermediating layer is formed of ITO (Indium Tin Oxide).

* * * * *